United States Patent [19]
Naud et al.

[11] Patent Number: 4,821,274
[45] Date of Patent: Apr. 11, 1989

[54] ELECTRO-OPTICAL SEMICONDUCTOR DEVICE AND A METHOD OF EMITTING LIGHT

[75] Inventors: Claude Naud, Ezanville; Gérard Guillot, Lyons; Benoît Deveaud, Lannion; Bernard Clerjaud, Montreuil, all of France

[73] Assignees: Centre National de la Recherche Scientifique, Paris; Etat Francais Represente Par Le Ministre Des Ptt, Issy Les Moulineaux, both of France

[21] Appl. No.: 887,084
[22] PCT Filed: Nov. 5, 1985
[86] PCT No.: PCT/FR85/00311
§ 371 Date: Jun. 27, 1986
§ 102(e) Date: Jun. 27, 1986
[87] PCT Pub. No.: WO86/03059
PCT Pub. Date: May 22, 1986

[30] Foreign Application Priority Data
Nov. 6, 1984 [FR] France .............................. 84 16891

[51] Int. Cl.$^4$ ................................................ H01S 3/19
[52] U.S. Cl. ........................................ 372/43; 357/17; 357/61; 372/44; 372/75
[58] Field of Search ................... 372/43, 44, 70, 75; 357/17, 61, 16

[56] References Cited
PUBLICATIONS

U. Kaufmann et al, "Spectroscopic Study of Vandium in GaP and GaAs", *Physical Review B*, vol. 25, No. 9, May 1, 1982, pp. 5598–5606.
A. Mircea-Roussel et al, "Optical Absorption and Photoluminescence of Vanadium in n-Type GaAs", *Solid State Communications*, vol. 36, pp. 171–173, 1980, pp. 171–173.
G. Guillot et al, "Decay of 3d Element Internal Photoluminescence Transitions in III-V Semiconductors", *Journal of Luminescence*, 31 & 32 (1984), pp. 439–441.

Primary Examiner—James W. Davie
Attorney, Agent, or Firm—Toren, McGeady & Associates

[57] ABSTRACT

An electro-optical device using a doped semiconductor medium under conditions of controlled excitation energy. The semiconductor medium is a doped binary, ternary or quaternary semiconductor alloy, namely, an III-V semiconductor alloy having at least one element from column III, and at least one element from column V of the Periodic Table, and doped with vanadium, titanium or niobium. Such an electro-optical device may be made into a laser or into a light emitting diode.

18 Claims, 5 Drawing Sheets

ELECTRO-OPTICAL SEMICONDUCTOR DEVICE AND A METHOD OF EMITTING LIGHT

BACKGROUND OF THE INVENTION

1. Field of the Invention

The present invention relates to electro-optical devices for emitting light radiation from a semiconductor medium which is subjected to controlled energy excitation.

2. Description of Related Art

Electro-optical semiconductor devices, for example light-emitting diodes (LEDs), semiconductor lasers, etc., have become widespread over the last few years. This is true, in particular, of lasers suitable for use in optical fiber telecommunications.

One of the problems which arises is developing lasers suitable for emitting in the transparency range of the optical fibers used. Thus, the use of silica based optical fibers requires lasers which emit in the infrared over a range of wavelengths extending from 1.3 μm to 1.7 μm.

The first semiconductor lasers were made with samples of gallium arsenide GaAs. However, the conditions required for obtaining a laser effect were particularly Draconian since the effect could only be obtained at a very low temperature using pulses at a very low repetition rate.

GaAs lasers have since been made to operate continuously and at ambient temperature, but at the price of using complex and heterogeneous structures which are known as "heterojunctions".

In addition to being complex in structure, it should be observed that GaAs lasers suffer from the major drawback of not emitting in the transparency range of optical fibers (1.3 μm to 1.7 μm). Conventional GaAs lasers emit at a wavelength of about 0.9 μm which corresponds to emission at the band edge of the material, i.e. at the transition of the forbidden band situated between the conduction band and the valence band.

Quaternary GaInAsP lasers are also known, and they emit around 1.5 μm, however the semiconductor material must then be associated with a substrate such as an InP substrate.

SUMMARY OF THE INVENTION

The present invention makes it possible to provide a laser which emits about 1.5 μm using a material having a shorter wavelength corresponding to the condution band to valence band transition, typically 0.87 μm for GaAs.

The laser effect can thus be obtained with such a material without being constrained to make use of emission at the edge of the forbidden band.

The invention is based on the surprising discovery that a doped semiconductor medium, as known per se and used heretofore as a substrate, can be used as an electro-optical device under conditions of controlled excitation energy. Such an elctro-optical device may be made into a laser or into a light-emitting diode.

The semiconductor medium on which the invention is based is a doped binary, ternary, or quarternary semicondcutor alloy, namely an III-V semiconductor alloy comprising at least one element from column III and at least one element from column V of the Periodic Table, and doped with vanadium, titanium, or niobium.

The column III element is advantageously gallium or indium, or possibly aluminum, and the column V element is advantageously arsenic or phosphorous.

The preferred semiconductor alloys in accordance with the invention are the following binary alloys GaP, GaAs and InP, with special preference going to GaAs, at least in laser applications.

Suitable ternary alloys are $Ga_{l-x}$, $Al_xAs$ and $GaAs_{l-x}P_x$ and suitable quarternary alloys are of $Ga_{l-x}$, $In_x$, $As_{l-y}$, $P_y$.

It has been observed that the light emission obtained with an electro-optical device in accordance with the invention is light-emission corresponding to internal emission.in vanadium in the form of $V^{3+}$, which corresponds to a wavelength lying between 1.5 μm, and 1.8 μm, depending on the material used.

When the dopant is titanium, the emission is internal to the titanium in the form $Ti^{2+}$ or $Ti^{3+}$. When the dopant is niobium, the emission is internal to niobium in the form $Nb^{3+}$.

The transition responsible for this light emission is not fully understood. It appears that the transition is a 1E or 3T2→3A2 transition (for $V^{3+}$, $Ti^{2+}$, and $Nb^{3+}$) or a 2T2 →2E transition (for $Ti^{3+}$), with the notation being Mulliken notation.

Thus, instead of using band-to-band emission (e.g. conduction band to valence band transition) as has been done in the past, the present invention uses emission internal to the dopant, i.e. to vanadium, titanium or niobium.

The vanadium, titanium or niobium dopant is preferably provided at a concentration of $10^{14}$ to $10^{17}$ atoms per $cm^3$ of non-doped semicondcutor alloy. The purity of the semiconductor alloy must be such that it contains less than $10^{16}$ undesired impurity atoms per $cm^3$.

The semiconductor medium of the invention may be a material in the form of a polycrystalline or a monocrystalline solid, or in the form of an epitaxial layer on a substrate constituted by an alloy suitable for providing a match with the lattice size of the epitaxial layer.

The invention also provides that the device includes means for exciting the doped semiconductor alloy with controlled energy which may be greater than or less than the transition energy between the valence band the conduction band of the non-doped semiconductor alloy.

Although the phenomenon cannot be completely explained, it appears that it takes place when energy is transferred between the energy bands of the semiconductor alloy and the energy levels of a dopant, some of which are located in the forbidden band of the semiconductor alloy.

In a first variant embodiment of the invention, in which the doped alloy includes a highly absorbent transition suitable for inducing a radiating transition which generates said light emission by means of a non-radiating transition, the device is arranged to emit coherent light radiation from said radiating transition.

The excitation means provided in this variant may comprise means for optical pumping using photons whose wavelengths are associated with energies which are lower than the transition energy between the valence band and the conduction band of the semiconductor alloy (for example a solid laser doped with neodymium).

Optical pumping may also be provided using photons whose wavelengths are associated with energies which are greater than or equal to the transition energy between the valence band and the conduction band of the semiconductor alloy.

One way of doing this consists in providing for the optical pumping means to include a semiconductor laser whose active material is the non-doped base alloy. In this case, the pumping energy is equal to the above-specified transition energy.

In a second variant embodiment of the invention, the device is arranged in the form of a light emitting diode and the above-mentioned excitation means include means for injecting electrons having the above-specified energy into the doped semiconductor alloy.

A third variant embodiment of the invention provides for the device to be arranged directly as a semiconductor laser, thus providing "electrical pumping".

In another aspect, the invention relates to a method of emitting light, in which a semiconductor medium constituted by a binary, ternary or quarternary III-V semiconductor alloy comprising at least one element from column III and at least one element from column V of the Periodic Table and doped with vanadium, titanium, or niobium, is excited by controlled excitation energy which is greater than the threshold of one of the two highly absorbent transitions of which said medium is capable. The invention also extends to various different implementations of the method.

BRIEF DESCRIPTION OF THE DRAWINGS

The invention will be better understood from reading the following detailed description which is made with reference to the accompanying drawings, in which.

DESCRIPTION OF THE PREFERRED EMBODIMENTS

III-V semiconductor alloys on which the invention is based are materials which are known per se. In particular, vanadium doped gallium arsenide is commercially available from the firm Wacker Chemitronic (Federal Republic of Germany).

However, this known semiconductor material has heretofore been used as a substrate for electronic components in which this material has only been used with electrical signals.

This semiconductor material is of considerable interest because of its good thermal stability, and it is the subject of several studies, however the role of the vandium dopant has not yet been fully understood and is the subject of considerable controversy.

Broadly speaking the literature on this subject may be divided into two main classes: namely a first class which considers that the vanadium introduces an energy level in the middle of the forbidden band between the valence band and the conduction band of the GaAs; and a second class which puts the acceptor level at about 0.2 eV below the conduction band. The fact that the media subjected to these studies came from two different sources, one having high resistivity and the other being of N-type, is not enough to explain these differences of interpretation.

The studies performed by the Applicants have been performed firstly on a Wacker base material and secondly on an N-type material, taken from two lots of samples having very different resistivities.

The N-type semiconductor material studied was drawn by the horizontal Bridgman method and was doped in the bath at 150 mg of vanadium per 400 g of GaAs. This bar was found to be of type N over practically its entire length, with the dopant concentration being about $2 \times 10^{16}$ atoms of vanadium per $cm^3$ of semiconductor alloy.

The study was performed both on samples from the N-type portion and from the end portion of the bar which was highly resistive.

Figure 1:
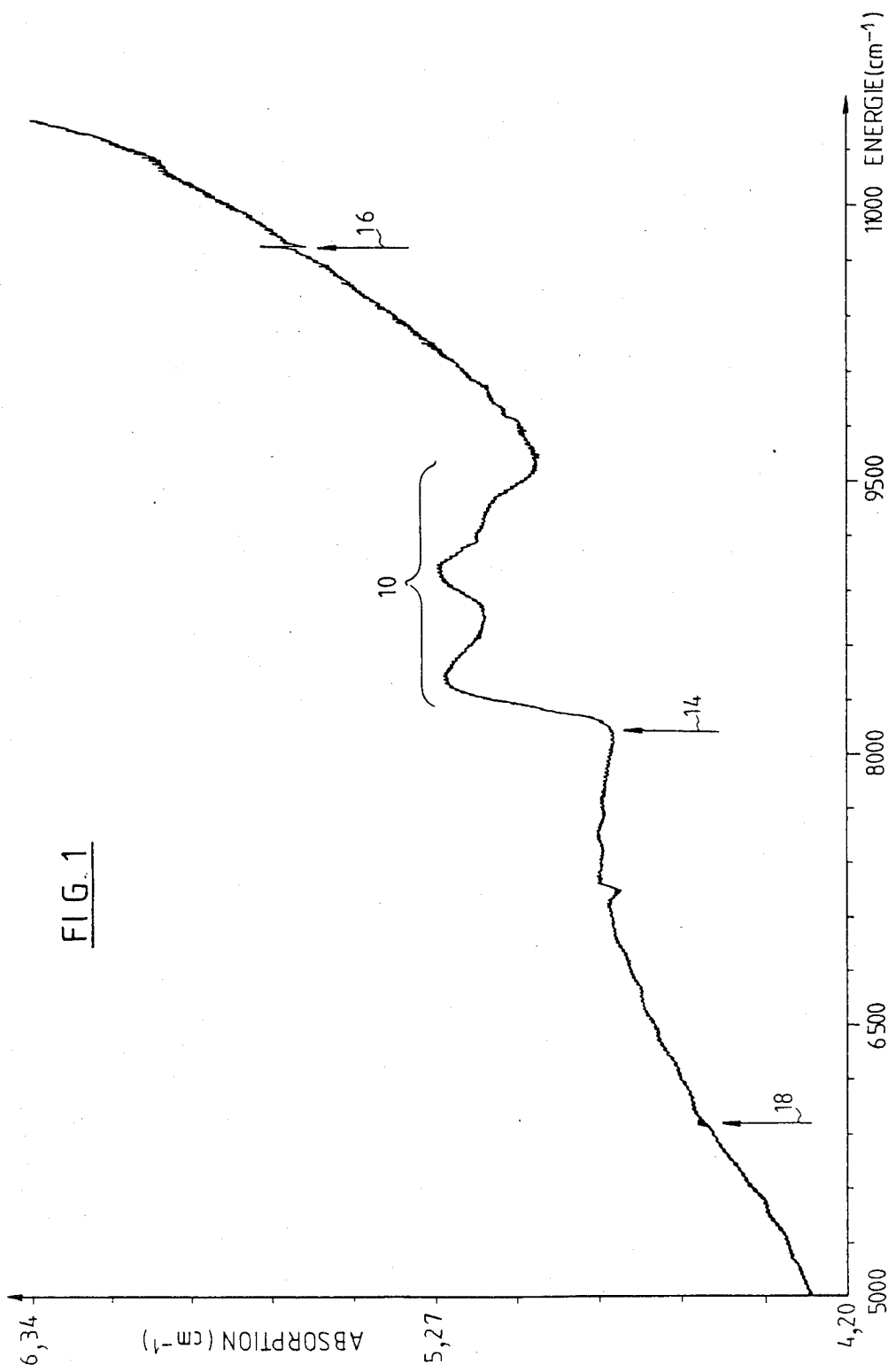
FIG. 1 is a graph showing the absorption spectrum of a GaAs alloy doped with vanadium.
Figure 2:
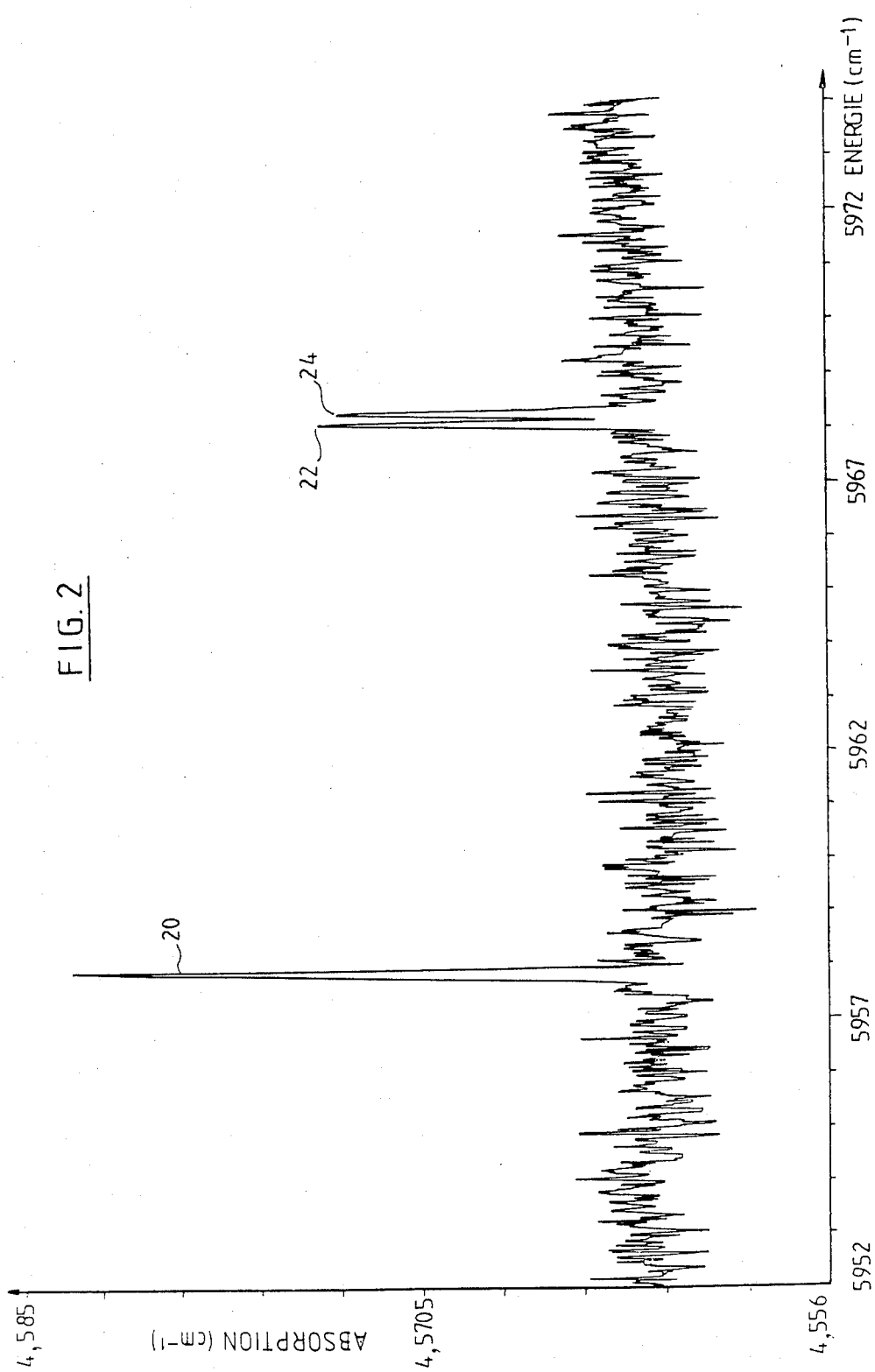
FIG. 2 is a graph of another absorption spectrum established using the same semiconductor medium as in FIG. 1, but having higher sensitivity in the light-emitting region.

The studies performed by the Applicants have shown that the absorption spectrum is similar for the Wacker samples and for the highly resistive N-type samples, regardless of the source used. FIGS. 1 and 2 show the overall shape at a temperature 6° K. for the highly resistive samples.

The highly conductive N-type samples have a different absorption spectrum (for resistivities of less than 1000 ohm centimeters).

In the following description, the term "materials used" designate Wacker material, highly resistive N-type material, and P-type material.

The studies performed concerning absorption, luminescence, luminescence excitation, RPE (Electronic paramagnetic resonance), and DLTS (deep level transient spectroscopy), have shown that there exists an acceptor level in GaAs located at about 0.2 eV below the conduction band.

FIG. 1 shows variations in absorption expressed in $cm^{-1}$ as a function of applied energy also expressed in $cm^{-1}$.

Figure 4:
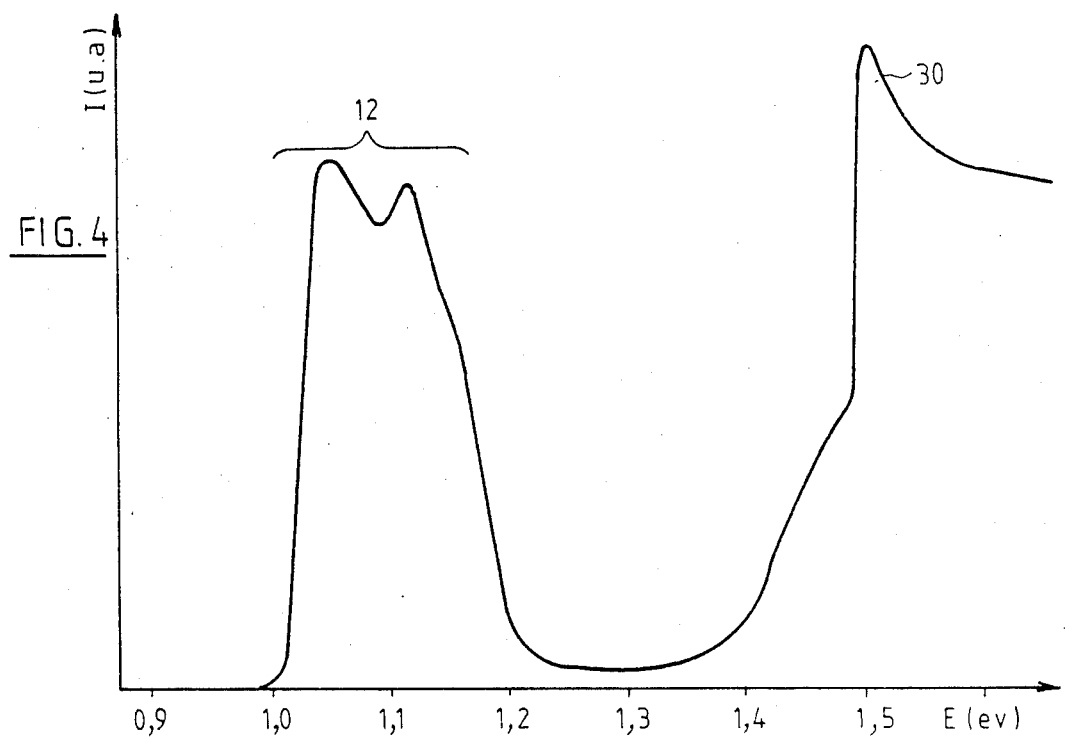
FIG. 4 is a graph showing the light emission excitation spectrum established for the same semiconductor medium as shown in FIGS. 1 to 3.

This spectrum shows that the main absorption band, given a general reference 10, corresponds to an applied energy of about 1.0 to 1.2 eV (8060 to 9672 $cm^{-1}$). This main band 10 is similar in shape to the main band designated by reference numeral 12 of the luminescence excitation spectrum which is shown in FIG. 4.

The zero phonon line associated with the main band 12 is designated by arrow 14 in FIG. 1. This zero phonon line has a width corresponding to 3 $cm^{-1}$ and is situated at an energy corresponding to $8131 \pm 0.3$ $cm^{-1}$.

A narrow line identified by arrow 16 and corresponding to an energy of $10773 \pm 0.3$ $cm^{-1}$ was also observed on all of the samples. This narrow line whose intensity is related to the intensity of the other lines has a width of 0.5 $cm^{-1}$.

The light emitting region of the absorption spectrum of FIG. 1 corresponds to an energy gap of about 5957 to 5968 $cm^{-1}$.

This region is identified by arrow 18 in FIG. 1 and is shown in detail in FIG. 2 which shows the same spectrum measured using greater sensitivity.

Examination of this spectrum shows a low energy line 20 at $5957.85 + 0.3$ cm$^{-1}$ and a high energy component in two lines 22 and 24 situated respectively at $5968.05$ cm$^{-1}$ and $5968.25 + 0.3$ cm$^{-1}$. It may be observed that these lines are extremely narrow (0.1 cm$^{-1}$) and that the pair of lines 22 and 24 are separated by a gap of 0.2 cm$^{-1}$.

Figure 3:
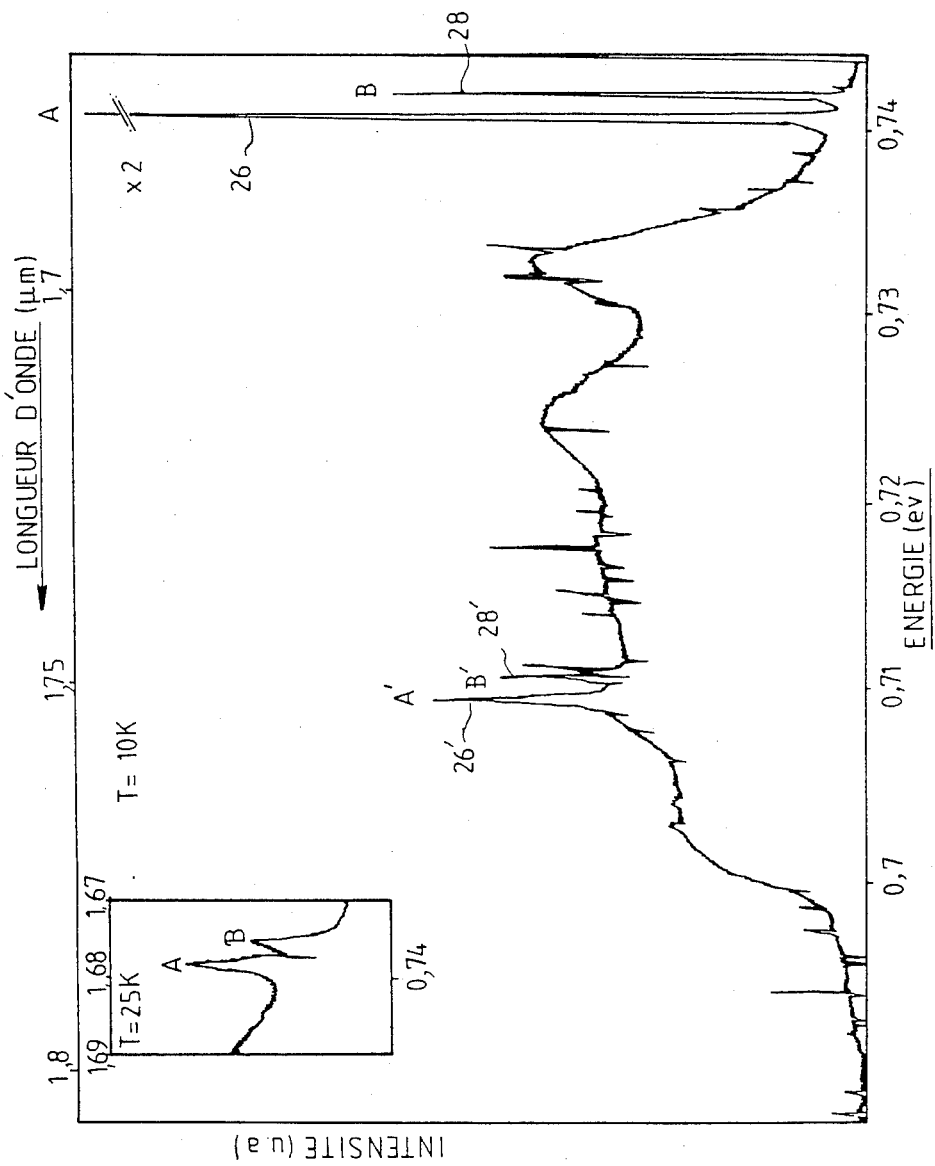
FIG. 3 is a graph of the emission spectrum obtained using the same semiconductor medium as shown in FIGS. 1 and 2.

These lines coincide exactly with the zero phonon luminescence lines designated 26 and 28 on the light emitting spectrum shown in FIG. 3. This spectrum plots emission intensity expressed in arbitrary units as a function of energy or wavelength, and was obtained at a temperature of 10° K. using YAG laser excitation.

The spectrum also shows phonon-assisted replicas 26' and 28' of the lines 26 and 28.

These experimental results give rise to two main conclusions:

(1) the transitions corresponding to lines 20, 22, and 24 of FIG. 2 are extremely intense in emission and very weak in absorption; and (2) the widths of the zero phonon lines are very different as a function of the transition, with the low energy lines being remarkably narrow.

The explanation suggested by the Applicants is that characteristic (1) shows that the radiating transition is forbidden and that there are no non-radiating channels, since otherwise the transition would be very weak in emission also: this may thus suggest a transition which is forbidden by spin.

Further, the fact that the lines are of different widths seems to indicate that they are governed by the internal stresses of the crystals.

Characteristic (2) shows that the response of the various zero-phonon lines to the internal stresses of the crystals is very different, with the low energy lines appearing to be insensitive to the stresses.

Figure 5:
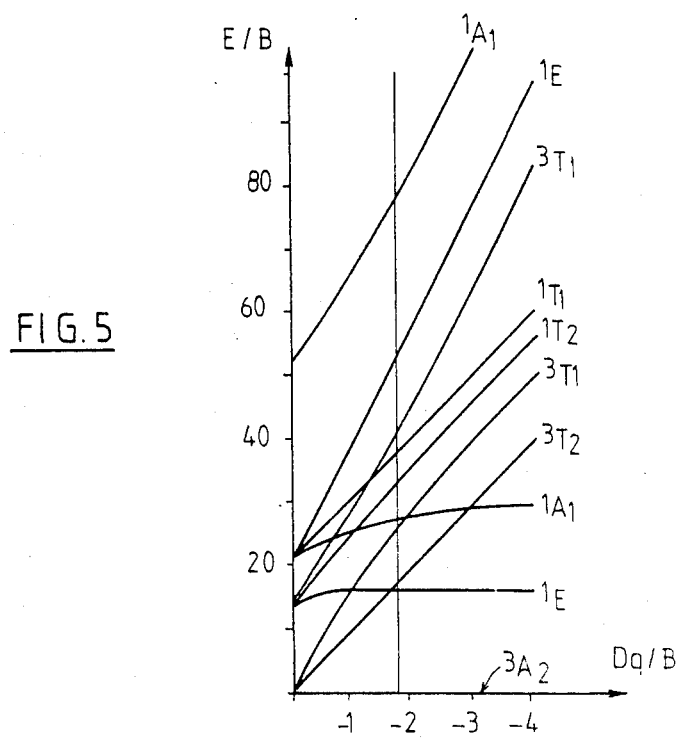
FIG. 5 is a diagram showing variations in the main energy levels of $V^{3+}$ in the $3d^2$ configuration in a crystal field of Td symmetry.

The Tanabe-Sugano diagram of FIG. 5 shows the variations of the main energy levels of V$^{3+}$ in the 3d$^2$ configuration in a crystal field of Td symmetry as a function of the stresses, with the levels being designated using Mulliken notation. It can be seen from this diagram that the 1E(1D) level is practically parallel to the fundamental 3A2 level.

Consequently, the 3A2(3F)$\rightleftarrows$1E(1D) transition energy is very insensitive to symmetrical distortions or stresses.

In contrast, the allowed 3A2(3F)$\rightleftarrows$3TA(3F) transition must be very sensitive to such stresses since the slope of the 4T1 level in the diagram of FIG. 5 is rather steep. The same applies to the 3A2$\rightleftarrows$3T1+1A1 transition.

It should also be observed that the 1A1(1G) level has little slope on this diagram and that the 3A2(3F)-$\rightleftarrows$1A1(1G) transition should thus correspond to a line of small width.

The Tanabe-Sugano diagram for V$^{2+}$ cannot be analyzed in this way.

These various results have led the Applicants to attribute the transition at 5958 cm$^{-1}$ to a forbidden 3A2(3F)$\rightleftarrows$3T2 transition, the main band with the zero phonon line at 8131 cm$^{-1}$ to a 3A2(3f)$\rightleftarrows$3T1 transition, and the narrow line at 10773 cm$^{-1}$ to the 3A2(3F)-$\rightleftarrows$1A1(1G) transition of V$^{3+}$ on a gallium site.

The interpretation suggested by the Applicants has been verified by measuring the duration of light emission. At 4.2° K. this lifetime is 0.15 ms to within a factor of 2 for all of the materials. This relatively long duration confirms the forbidden character of the light-emitting transmission, since the lifetimes of allowed transitions are generally much shorter. This also shows that GaAs encourages the laser effect.

Further, the excitation spectra of the previously studied typical light-emitting bands of vanadium have been established. The spectrum of FIG. 4 shows the variation in emission with intensity I being expressed in arbitrary units as a function of the light emission excitation energy E expressed in eV.

The FIG. 4 spectrum shows the band 12 mentioned above. This is a very wide band of intrinsic excitation centered on 1.1 eV. This excitation band has a threshold at 1 eV and two clearly visible structures having maxima at 1.05 eV and 1.12 eV, together with a less visible structure at 1.16 eV. It has exactly the same shape as the absorption curve shown in FIG. 1.

The spectrum also shows a band 30 situated at 1.5 eV.

The band 12 may thus be attributed to internal absorption of the 3A2$\rightarrow$3T1 transition of V$^{3+}$ wheres the band 30 may be attributed to absorption of the valence band to conduction band transition of GaAs. This shows that it is possible to provide electrical pumping by injecting electron-hole pairs.

From the Applicants' experimental results, it appears that the vanadium is in the V$^{3+}$ state, i.e. neutral, in each of the "materials used" as defined above, which goes against previous interpretations. This thus proves that vanadium does not act as an acceptor in the middle of the forbidden band gap of the semiconductor alloy. It is thus possible to create the charged V$^{3+}$ state of vanadium by introducing it in sufficient quantity into a P-type material, in particular GaP, GaAs, and InP.

It is thus not the vanadium which makes the material semiinsulating. In InP, the vanadium is not an acceptor since the potential acceptor level lies above the conduction band.

Comparable experimental results have been obtained with the other semiconductor alloys of the invention, and with titanium or niobium being used as the dopant instead of vanadium.

Figure 6:
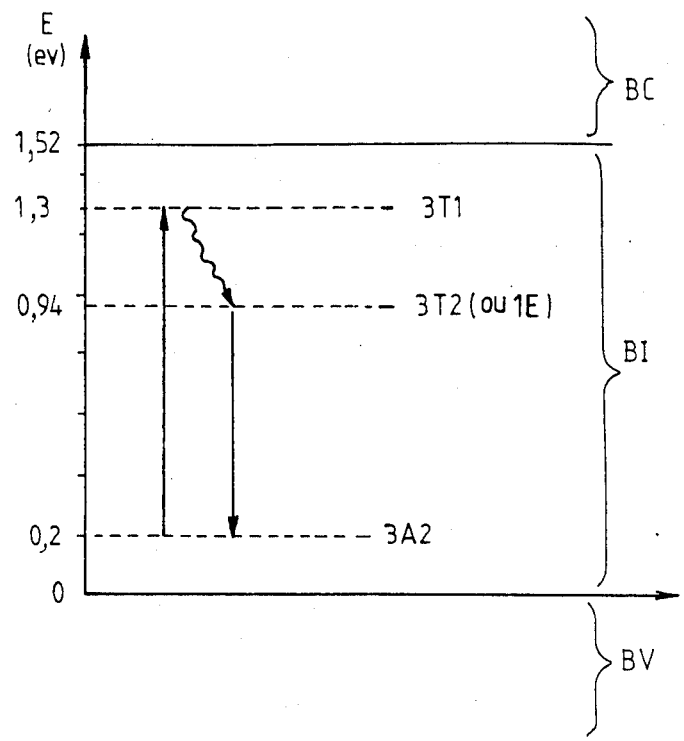
FIG. 6 is a diagram showing the relative disposition of the energy bands in the GaAs alloy and the main energy levels of the vanadium dopant in the form $V^{3+}$.

Reference is now made to the diagram of FIG. 6 (established at a temperature of 6° K.) in which BV, BI and BC respectively designate the valence band, the forbidden band, and the conduction band of the semiconductor alloy. Energy levels 3A2, 3T2, and 3T1 of the vanadium dopant in the V$^{3+}$ form are also shown on this diagram. Light emission responds to emission internal to vanadium in the V$^{3+}$ form. The transition responsible for this emission is the 3T2$\rightarrow$3A2 transition. A similar diagram is obtained for niobium in the Nb$^{3+}$ form, where it should be noted that the intermediate level is 1E instead of 3T2.

Several methods may be used to trigger light emission.

The semiconductor medium may be excited to cause electrons to pass from level 3A2 to level 3T1 (a highly absorbent transition). De-excitation then follows, thereby causing electrons to pass initially from level 3T1 to level 3T2: this is a fully permitted transition using a non-radiating phonon process (lattice vibration). This non-radiating transition is followed by a highly forbidden radiating 3T2$\rightarrow$3A2 transition with photons being emitted. Experimental results have shown that the lifetime of the intermediate or emitting 3T2 state is relatively long (0.18 ms at 4° K.). This suggests a forbidden transition.

In this case, the excitation energy is less than the transition energy between the valence band and the conduction band. A neodymium doped YAG, or glass or any other material laser may advantageously be used.

It is also possible to excite the semiconductor medium using an energy greater than or equal to the transition energy between the valence band and the conduction band, which energy corresponds to the maximum (band 30) of the light-emitting excitation curve shown in FIG. 4. In this case a semiconductor laser such a conventional non-doped GaAs or a flash laser may be used as may any other type of laser, for example a gas laser, provided the laser frequency is greater than or equal to a threshold which corresponds to the above-specified transition energy.

The semiconductor medium may also be excited by injecting electron-hole pairs into the medium.

When using the above-mentioned excitation means, a transfer of energy is set up between the bands of the semiconductor alloy and the vanadium dopant, thereby bringing it to an excited state without being obliged to use internal transitions within the dopant itself.

The fact that the vanadium dopant is included in a matrix which is a semiconductor also constitutes an important advantage since, as shown above, the electron-hole pairs in the semiconductor alloy are responsible for highly effective excitation of light emission in vanadium.

An electro-optical device in accordance with the invention may also be embodied by combining the above-defined semiconductor medium with excitation means suitable for exciting the doped semiconductor alloy with a controlled energy which may be greater than or less than the transition energy between the valence band and the conduction band of the nondoped semiconductor alloy.

The semiconductor medium is known per se and may be prepared using known methods.

The starting non-doped semiconductor alloy must be very pure, i.e. it must, if possible, contain less than $10^{16}$ unwanted impurity atoms per $cm^3$. The concentration of vanadium dopant as added to this alloy must lie in the range $10^{14}$ and $10^{17}$ atoms of dopant per $cm^3$ of semiconductor alloy.

The medium may be made N-type or P-type by adding donor or acceptor impurities.

The semicondcutor medium may be a material which is a polycrystalline or a monocrystalline solid, or else it may be an epitaxial layer on a substrate constituted by an alloy suitable for providing lattice size matching the epitaxial layer.

The solid material is prepared by growing the semiconductor material from a monocrystalline seed. The epitaxial layer is produced, for example, by the liquid phase epitaxy technique for growing the crystal of semiconductor alloy including the vanadium dopant, on a substrate made from the same alloy.

These manufacturing processes are well-known to the person skilled in the art and it is not part of the invention to describe them in detail in this application.

In a first variant implementation of the invention, the device is arranged to emit coherent light radiation from the radiating 3T2→3A2 transition (FIG. 6) by taking advantage of the fact that the semiconductor medium includes a highly absorbent transition (3A2→3T1) suitable for inducing said radiating transition (3T2→3A2) via a non-radiating transition (3T1→3T2).

In order to do this, the semiconductor medium is excited by illuminating it with photons whose energy is not less than the transition energy between levels 3A2 and 3T1.

A convenient solution for providing this illumination is to use optical pumping means with photons whose wavelengths are associated with energies which are greater than or equal to the above-defined energy.

Figure 7:
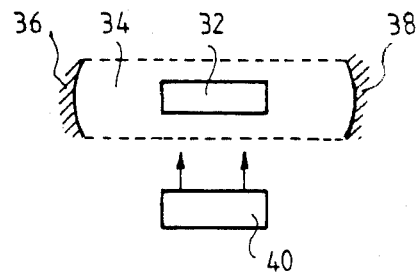
FIG. 7 is a diagram of an optically pumped semicondcutor laser in accordance with the invention.

A device made in this manner is shown highly diagrammatically in FIG. 7. It comprises a semiconductor medium 32 in accordance with the invention inside a laser cavity 34 which is elongate in shape and delimited at its ends by partially reflecting mirrors 36 and 38. A source 40 suitable for providing optical pumping of the material is disposed to one side of the laser cavity 34.

The source 40 emits photons whose wavelengths are associated with energies suitable for causing electrons to be brought to level 3T1, either directly or indirectly.

Although the source 40 may be constituted by any laser source emitting at a suitable wavelength, a convenient means is to use a semiconductor laser whose active material is the non-doped basic alloy. Thus, when using a vanadium doped GaAs semiconductor medium, it is highly advantageous to use a GaAs laser diode which will emit photons of exactly the right energy to provide optical pumping of the semiconductor medium.

In a second variant, the device in accordance with the invention is arranged in the form of a light-emitting diode and the above-defined excitation means are means for injecting electrons into the doped semiconductor alloy, which electrons are at an energy corresponding to the transition energy between the valence band and the conduction band of the non-doped semiconductor alloy.

Figure 8:
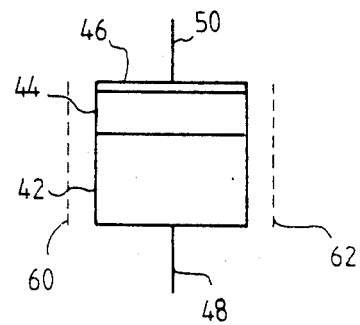
FIG. 8 is a diagram of a light emitting device made in accordance with the invention.

An example of such a diode is shown diagrammatically in FIG. 8.

It comprises a GaAs substrate 42 with a layer 44 of vanadium doped GaAs disposed thereon, which layer is covered with a layer 46 of a P+ or N+ material. Two electrodes 48 and 50 are respectively connected to the substrate 42 and to the layer 46. A DC voltage V, or pulses, are applied across teh two electrodes in order to cause the desired light emission.

In a first example, corresponding in particular to GaAs, the substrate 42 is N+-type, the layer 44 is P-type and the layer 46 is P+-type. In a second example using, in particular InP, the substrate is P+-type, the layer 44 is N-type, and the layer 46 is N+-type.

In a variant, the device in accordance with the invention is itself arranged in the form of a semiconductor laser thus providing so-called "electrical" pumping. This constitutes an integrated electro-optical device in which the semiconductor medium of the invention and the laser diode made from the same semiconductor alloy (but undoped) are both provided on a common microstructure. Such a device may be embodied on the basis of the above-described diode by using conventional double heterostructure techniques.

FIG. 8 illustrates this by cavity-forming mirrors referenced 60 and 62. These mirrors may be constituted in any of the manners known to the person skilled in the art: the mirrors may be external or they may be defined by cleaved side faces of the crystal, optionally covered with a suitable material.

Experiments performed by the Applicants have shown that a device in accordance with the invention may be arranged in the form of a laser emitting at the following wavelengths:

GaP : V 1.567 μm
GaAs : V 1.678 μm
InP : V 1.757 μm

If titanium is used as the dopant, the resulting lasers emit at a slightly longer wavelength, i.e. about 2 μm.

If niobium is used as the dopant, lasers are provided which emit at wavelengths of 1.55 μm to 1.7 μm.

An electro-optical device in accordance with the invention may be embodied in the form of a light-emitting diode or in the form of laser. If it is embodied in the form of a laser, its preferred application lies with optical fiber telecommunications.

We claim:

1. An electro-optical device for emitting light radiation, said device comprising:
    a semi-conductor structure having an active layer of a semiconductor medium, said medium being a binary, ternary or quaternary III-V semiconductor alloy comprising at least one element from column III of the Periodic Table selected from the group consisting of gallium, indium and aluminum, and at least one element from column V of the Periodic Table selected from the group consisting of arsenic and phosphorous, and doped with vanadium, titanium or biobium as dopant, said medium being capable of two highly absorbent transitions; and
    means for exciting the doped semiconductor alloy with a controlled energy greater than the threshold of one of said two highly absorbent transitions, whereby energy is transferred between the energy bands of the semiconductor alloy and the energy levels of the dopant, and light radiation is emitted.

2. A device according to claim 1, wherein the light emission is a luminescent emission corresponding to internal emission in vanadium in the $V^{3+}$ form, in titanium in the $Ti^{2+}$ or $Ti^{3+}$ form, or in niobium in the $Nb^{3+}$, and corresponding to a wavelength lying between about 1.5 μm and about 2.3 μm depending on the alloy and the impurity used.

3. A device according to claim 2, wherein the transition responsible for said luminescent emission is a 1E or $3T2 \rightarrow 3A2$ transition for $V^{3+}$, $Ti^{2+}$, and $Nb^{3+}$, or a $2T2 \rightarrow 2E$ transition for $Ti^{3+}$, with the notation being Mulliken notation.

4. A device according to claim 1, wherein the semiconductor alloy is selected from: GaP, GaAs, and InP, and the dopant is vanadium.

5. A device according to claim 4, wherein the semiconductor alloy is GaAs and the dopant is vanadium.

6. A device according to claim 1, wherein the vandium, titanium or niobium dopant is at a concentration of $10^{14}$ to $10^{17}$ atoms per $cm^3$ of semiconductor alloy.

7. A device according to claim 1, wherein the semiconductor alloy contains less than $10^{16}$ undesired impurity atoms per $cm^3$.

8. A device according to claim 1, wherein the semiconductor medium is a polycrystalline or a monocrystalline solid medium.

9. A device according to claim 1, wherein the semiconductor medium is an epitaxial layer on a substrate constituted by an alloy suitable for establishing lattice size matching with the epitaxial alyer.

10. A device according to claim 1, wherein said doped alloy includes a highly absorbent transition suitable for introducing a radiating transition which generates said light emission by means of a non-radiating transition, and which is arranged to emit coherent light radiation from said radiating transition.

11. A device according to claim 10, wherein the excitation means include optical pumping means using photons, having wavelengths associated with energies less than the transition energy between the valence band and the conduction band of the semiconductor alloy.

12. A device according to claim 10, wherein the excitation means includes optical pumping means using photons whose wavelengths are associated with energies greater than or equal to the transition energy between the valence band and the conduction band of the semiconductor alloy.

13. A device according to claim 12, wherein the optical pumping means comprise a semiconductor laser whose active material is the non-doped base alloy.

14. A device according to claim 13, wherein the semiconductor laser is a GaAs laser.

15. A device according to claim 13, wherein the semiconductor laser is an InP laser.

16. A device according to claim 1, wherein said device is arranged in the form of a light-emitting diode and that the excitation means comprise means for injecting electrons having said energy into the doped semiconductor alloy.

17. A device according to claim 12, wherein said device is arranged so that it itself constitutes a semiconductor laser.

18. A method emitting light, said method comprising:
    providing a semiconductor structure having an active layer of a semiconductor medium, said medium being a binary, ternary or quaternary III-V semiconductor alloy comprising at least one element from column III of the Periodic Table selected from the group consisting of gallium, indium and aluminum, and at least one element from column V of the Periodic Table selected from the group consisting of arsenic and phosphorous, and doped with vanadium, titanium or niobium dopant, said medium being capable of two highly absorbent transitions; and
    exciting the doped semiconductor alloy with a controlled excitation energy greater than the threshold of one of said two highly absorbent transitions, whereby energy is transferred between the energy bands of the semiconductor alloy and the energy levels of the dopant, and light radiation is emitted.

* * * * *